(12) United States Patent
Conley et al.

(10) Patent No.: US 7,461,199 B2
(45) Date of Patent: *Dec. 2, 2008

(54) PIPELINED PARALLEL PROGRAMMING OPERATION IN A NON-VOLATILE MEMORY SYSTEM

(75) Inventors: Kevin M. Conley, San Jose, CA (US); Yoram Cedar, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/611,706

(22) Filed: Dec. 15, 2006

(65) Prior Publication Data

US 2007/0091680 A1   Apr. 26, 2007

Related U.S. Application Data

(63) Continuation of application No. 11/058,359, filed on Feb. 14, 2005, now Pat. No. 7,162,569, which is a continuation of application No. 10/081,375, filed on Feb. 22, 2002, now Pat. No. 6,871,257.

(51) Int. Cl.
*G06F 5/06* (2006.01)
*G11C 7/10* (2006.01)
*G11C 16/06* (2006.01)

(52) U.S. Cl. .................. 711/103; 711/150; 711/168; 711/169; 710/53; 365/185.11; 365/189.04; 365/189.05; 365/230.03

(58) Field of Classification Search ............... 711/103, 711/168, 169, 150; 365/185.11, 189.04, 365/189.05, 230.03; 710/53
See application file for complete search history.

(56) References Cited

U.S. PATENT DOCUMENTS

| | | | |
|---|---|---|---|
| 5,513,138 | A | 4/1996 | Manabe et al. |
| 5,523,980 | A | 6/1996 | Sakui et al. |
| 6,172,906 | B1 | 1/2001 | Estakhri et al. |
| 6,317,371 | B2 | 11/2001 | Katayama et al. |
| 6,330,185 | B1 | 12/2001 | Wong et al. |

(Continued)

OTHER PUBLICATIONS

International Search Report mailed Jun. 2, 2003.

(Continued)

*Primary Examiner*—Jack A Lane
(74) *Attorney, Agent, or Firm*—Davis Wright Tremaine LLP

(57) ABSTRACT

The present invention allows for an increase in programming parallelism in a non-volatile memory system without incurring additional data transfer latency. Data is transferred from a controller to a first memory chip and a programming operation is caused to begin. While that first memory chip is busy performing that program operation, data is transferred from the controller to a second memory chip and a programming operation is caused to begin in that chip. Data transfer can begin to the first memory chip again once it has completed its programming operation even though the second chip is still busy performing its program operation. In this manner high parallelism of programming operation is achieved without incurring the latency cost of performing the additional data transfers. Two sets of embodiments are presented, one that preserves the host data in a buffer until successful programming of that data is confirmed and one that does not require that success be achieved and that does not preserve the data thus achieving a higher rate of data programming throughput.

6 Claims, 7 Drawing Sheets

U.S. PATENT DOCUMENTS 6,349,056 B1 * 2/2002 Conley et al. .......... 365/185.04
6,426,893 B1 * 7/2002 Conley et al. .......... 365/185.11
6,525,952 B2   2/2003 Araki et al.
6,570,785 B1 * 5/2003 Mangan et al. ......... 365/185.02
2002/0163837 A1   11/2002 Wong

OTHER PUBLICATIONS

First Office Action for Chinese Application No. 03808287.X for San Disk Corporation, Mailed Jul. 6, 2006, 2 pages.

* cited by examiner

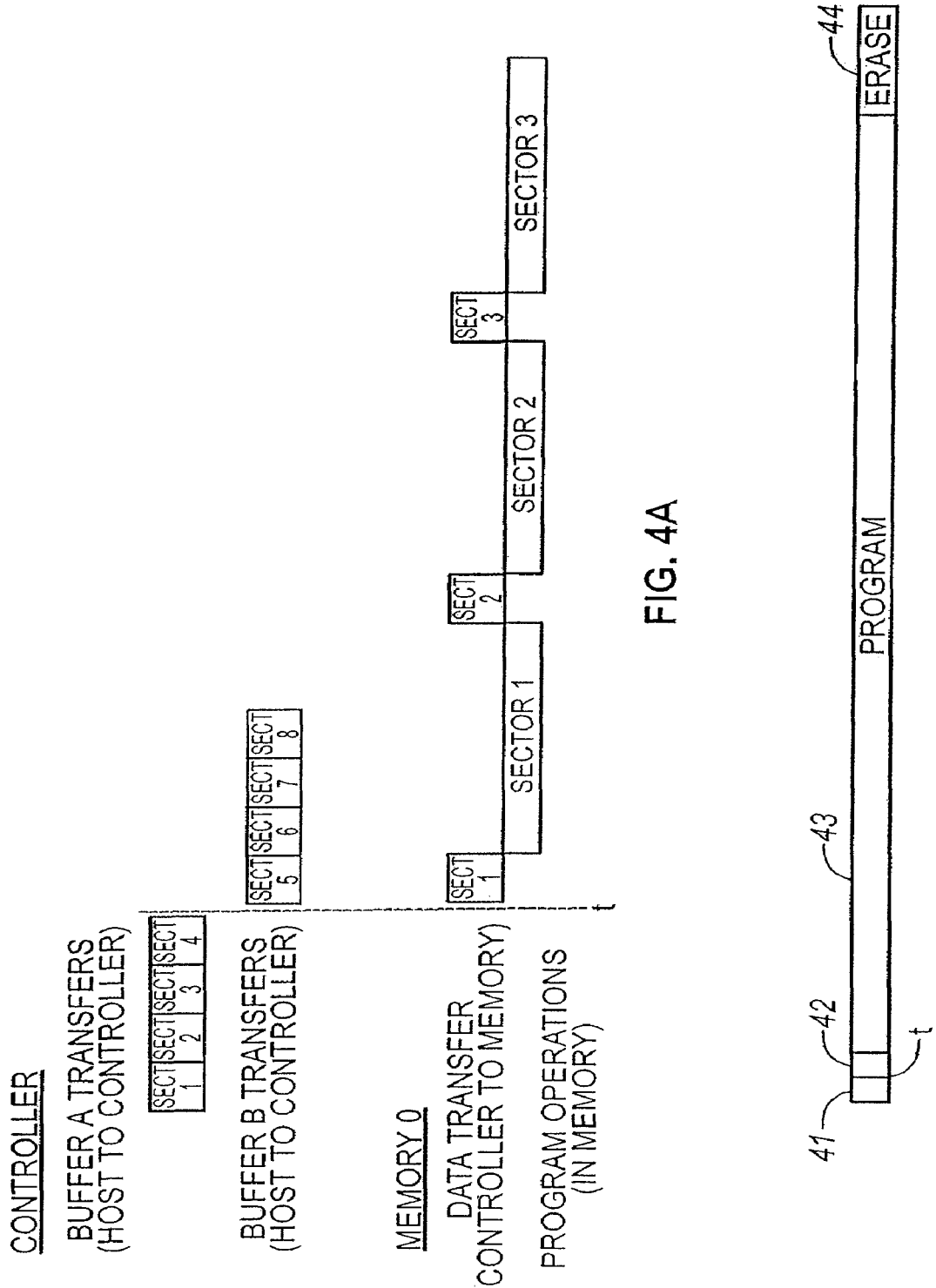

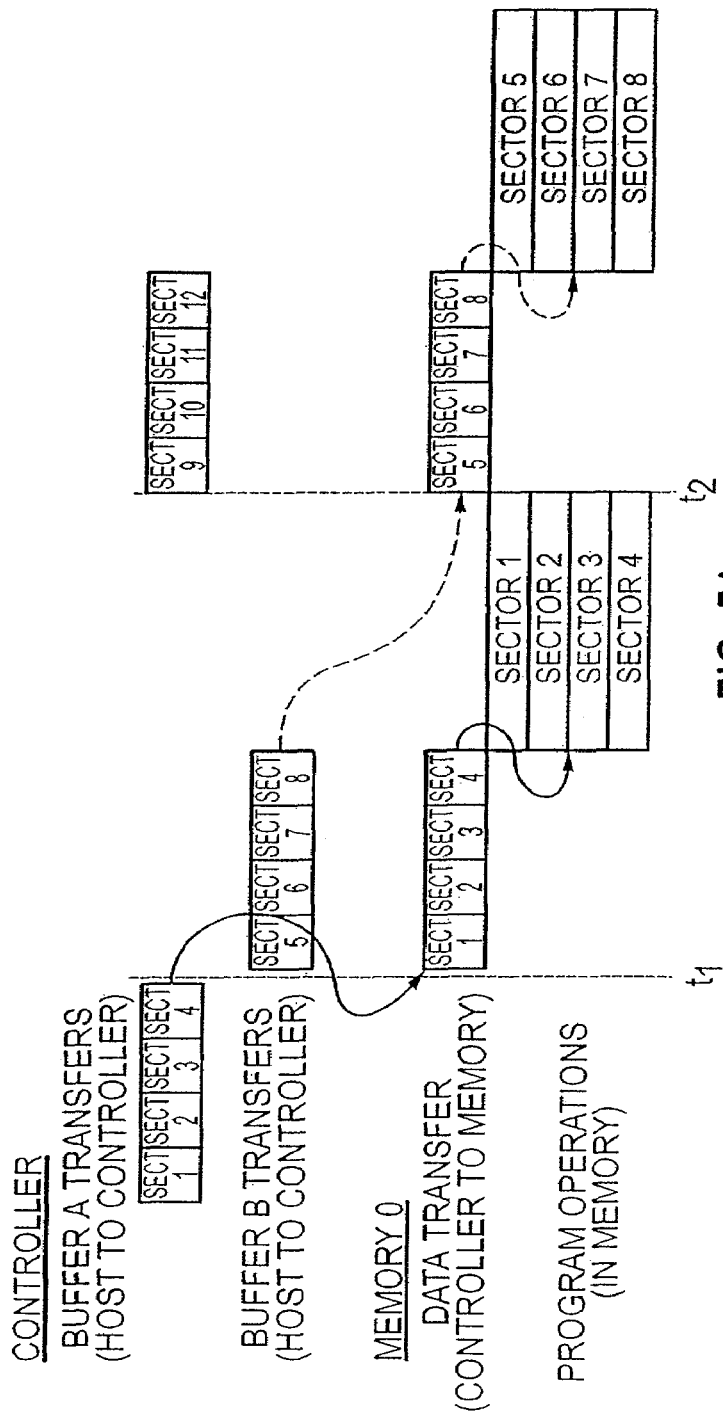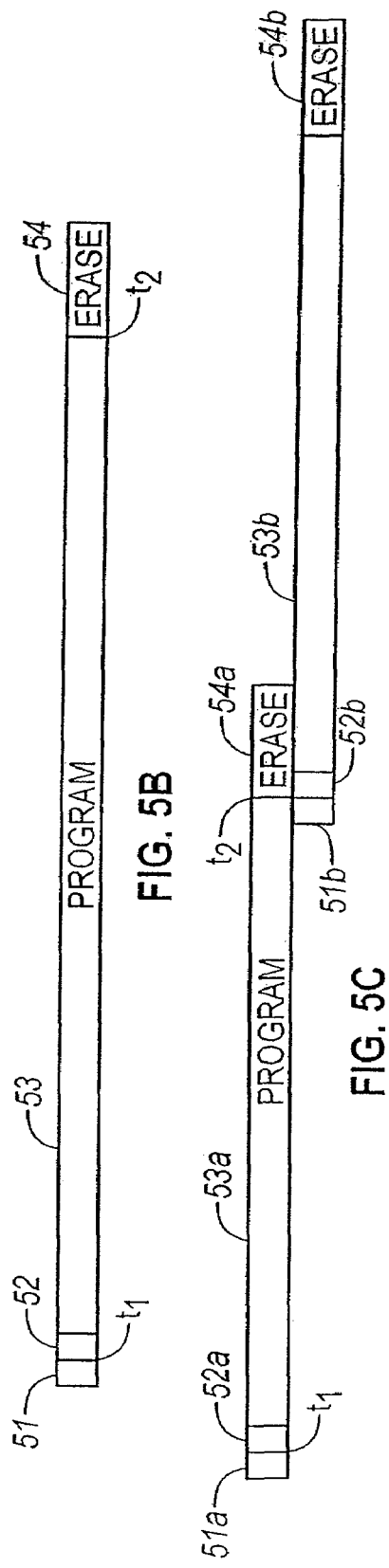
FIG. 5A
FIG. 5B
FIG. 5C

PIPELINED PARALLEL PROGRAMMING OPERATION IN A NON-VOLATILE MEMORY SYSTEM

CROSS-REFERENCE TO RELATED APPLICATION

This application is a continuation of patent application Ser. No. 11/058,359, filed on Feb. 14, 2005, now U.S. Pat. No. 7,162,569, which is in turn a continuation application Ser. No. 10/081,375, filed on Feb. 22, 2002, now U.S. Pat. No. 6,871,257, which are incorporated herein by this reference.

BACKGROUND OF THE INVENTION

This invention pertains to the field of semiconductor non-volatile data storage system architectures and their methods of operation, and has application to data storage systems based on flash electrically erasable and programmable read-only memories (EEPROMs).

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses (LBAs) received by the memory sub-system from a host, and physical block numbers (PBNs) and page addresses within the memory cell array. This translation often involves use of intermediate terms for a logical block number (LBN) and logical page. The controller also manages the low level flash circuit operation through a series of commands that it issues to the flash memory devices via an interface bus. Another function the controller performs is to maintain the integrity of data stored to the subsystem through various means, such as by using an error correction code (ECC).

FIG. 1 shows a typical internal architecture for a flash memory device 131. The primary features include an input/output (I/O) bus 411 and control signals 412 to interface to an external controller, a memory control circuit 450 to control internal memory operations with registers for command, address and status signals. One or more arrays 400 of flash EEPROM cells are included, each array having its own row decoder (XDEC) 401 and column decoder (YDEC) 402, a group of sense amplifiers and program control circuitry (SA/PROG) 454 and a data register 404. Presently, the memory cells usually include one or more conductive floating gates as storage elements but other long term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

If desired, a plurality of arrays 400, together with related X decoders, Y decoders, program/verified circuitry, data registers, and the like are provided, for example as taught by U.S. Pat. No. 5,890,192, issued Mar. 30, 1999, and assigned to SanDisk Corporation, the assignee of this application, which is hereby incorporated by this reference. Related memory system features are described in U.S. Pat. No. 6,426,893, which is expressly incorporated herein by this reference.

The external interface I/O bus 411 and control signals 412 can include the following:

CS—Chip Select. Used to activate flash memory interface.
RS—Read Strobe. Used to indicate the I/O bus is being used to transfer data from the memory array.
WS—Write Strobe. Used to indicate the I/O bus is being used to transfer data to the memory array.
AS—Address Strobe. Indicates that the I/O bus is being used to transfer address information.
AD[7:0]—Address/Data Bus This I/O bus is used to transfer data between controller and the flash memory command, address and data registers of the memory control 450.

In addition to these signals, it is also typical that the memory have a means by which the storage subsystem controller may determine that the memory is busy performing some task. Such means could include a dedicated signal or a status bit in an internal memory register that is accessible while the memory is busy.

This interface is given only as an example as other signal configurations can be used to give the same functionality. FIG. 1 shows only one flash memory array 400 with its related components, but a multiplicity of such arrays can exist on a single flash memory chip that share a common interface and memory control circuitry but have separate XDEC, YDEC, SA/PROG and DATA REG circuitry in order to allow parallel read and program operations.

Data is transferred from the memory array through the data register 404 to an external controller via the data registers' coupling to the I/O bus AD[7:0] 411. The data register 404 is also coupled the sense amplifier/programming circuit 454. The number of elements of the data register coupled to each sense amplifier/programming circuit element may depend on the number of bits stored in each storage element of the memory cells, flash EEPROM cells each containing one or more floating gates as the storage elements. Each storage element may store a plurality of bits, such as 2 or 4, if the memory cells are operated in a multi-state mode. Alternatively, the memory cells may be operated in a binary mode to store one bit of data per storage element.

The row decoder 401 decodes row addresses for the array 400 in order to select the physical page to be accessed. The row decoder 401 receives row addresses via internal row address lines 419 from the memory control logic 450. A column decoder 402 receives column addresses via internal column address lines 429 from the memory control logic 450.

FIG. 2 shows an architecture of a typical non-volatile data storage system, in this case employing flash memory cells as the storage media. In one form, this system is encapsulated within a removable card having an electrical connector extending along one side to provide the host interface when inserted into a receptacle of a host. Alternatively, the system of FIG. 2 may be embedded into a host system in the form of a permanently installed embedded circuit or otherwise. The system utilizes a single controller 101 that performs high-level host and memory control functions. The flash memory media is composed of one or more flash memory devices, each such device often formed on its own integrated circuit chip. The system controller and the flash memory are connected by a bus 121 that allows the controller 101 to load command, address, and transfer data to and from the flash memory array. (The bus 121 includes 412 and 411 of FIG. 1.) The controller 101 interfaces with a host system (not shown) with which user data is transferred to and from the flash memory array. In the case where the system of FIG. 2 is included in a card, the host interface includes a mating plug and socket assembly (not shown) on the card and host equipment.

The controller 101 receives a command from the host to read or write one or more sectors of user data starting at a particular logical address. This address may or may not align with the first physical page in a block of memory cells.

In some prior art systems having large capacity memory cell blocks that are divided into multiple pages, the data from a block that is not being updated needs to be copied from the original block to a new block that also contains the new, updated data being written by the host. In other prior art systems, flags are recorded with the user data in pages and are used to indicate that pages of data in the original block that are being superseded by the newly written data are invalid. A mechanism by which data that partially supersedes data stored in an existing block can be written without either copying unchanged data from the existing block or programming flags to pages that have been previously programmed is described in U.S. Pat. No. 6,763,424, which is expressly incorporated herein by this reference.

Non-volatile memory systems of this type are being applied to a number of applications, particularly when packaged in an enclosed card that is removable connected with a host system. Current commercial memory card formats include that of the Personal Computer Memory Card International Association (PCMCIA), CompactFlash (CF), MultiMediaCard (MMC) and Secure Digital (SD). One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include one or more arrays of floating-gate memory cells and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than the capacity of the memory block, often being equal to the standard disk drive sector size, 512 bytes. In one commercial architecture, the memory system block is sized to store one sector of user data plus overhead data, the overhead data including information such as an error correction code (ECC) for the user data stored in the block, a history of use of the block, defects and other physical information of the memory cell block. Various implementations of this type of non-volatile memory system are described in the following United States patents and pending applications assigned to SanDisk Corporation, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859, 5,712,180, 6,151,248. Another type of non-volatile memory system utilizes a larger memory cell block size that stores multiple sectors of user data.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. Although it is currently most common to store one bit of data in each floating gate cell by defining only two programmed threshold levels, the trend is to store more than one bit of data in each cell by establishing more than two floating-gate transistor threshold ranges. A memory system that stores two bits of data per floating gate (four threshold level ranges or states) is currently available, with three bits per cell (eight threshold level ranges or states) and four bits per cell (sixteen threshold level ranges) being contemplated for future systems. Of course, the number of memory cells required to store a sector of data goes down as the number of bits stored in each cell goes up. This trend, combined with a scaling of the array resulting from improvements in cell structure and general semiconductor processing, makes it practical to form a memory cell block in a segmented portion of a row of cells. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

Since the programming of data into floating-gate memory cells can take significant amounts of time, a large number of memory cells in a row are typically programmed at the same time. But increases in this parallelism cause increased power requirements and potential disturbances of charges of adjacent cells or interaction between them. U.S. Pat. No. 5,890,192 of SanDisk Corporation, which is incorporated above, describes a system that minimizes these effects by simultaneously programming multiple pages (referred to as chunks in that patent) of data into different blocks of cells located in different operational memory cell units (sub-arrays). Memory systems capable of programming multiple pages in parallel into multiple sub-array units are described in U.S. Pat. No. 6,426,893, which is incorporated by reference above, and U.S. Pat. No. 6,570,785, which is expressly incorporated herein by this reference.

In order to improve performance by reducing programming time, a goal is to program as many cells in parallel as can reasonably be done without incurring other penalties. The performance of a memory is based on how many cells can be programmed at once and on how long is required to transfer data. As programming times are decreased and programming parallelism is increased, the percentage of the overall program operation time that is due to the data transfer time increases.

Methods found in the prior art for reducing the data transfer time for parallel program operations include the use of multiple or wider data transfer busses between the controller and the memory arrays. For example, U.S. Pat. No. 6,172,906 describes a memory structure for writing sectors simultaneously to multiple flash memory devices by doubling the data bus between the controller and a pair of flash sectors. The data to be written into this pair of sectors is then loaded simultaneously into the buffers of the controller, simultaneously transferred via the bus to the sectors' respective registers (a byte for each at a time), and simultaneously programmed into both sectors' array.

Although this increases performance, it is at the increased system cost of the multiple or wider data transfer bus. This has several disadvantages. Increasing the bus size increases the number of connections to the controller. This requires the addition of a number of pins to the controller, which increases the material and manufacturing cost of the device and also affects the resultant package size. In addition to the practical limitations on the size of the bus, the prior art is also limited in requiring that the loading of the controller's buffers, the transferal of data to the respective registers, and the programming of the two sectors occurs simultaneously at each step in a "lock-step" arrangement that is not readily extendable to a larger numbers of sectors.

SUMMARY OF THE INVENTION

According to one principal aspect of the present invention, briefly and generally, programming parallelism in the system is increased without incurring additional data transfer latency. Data transfer and programming for multiple memory units is pipelined. Data is transferred from a controller to a first memory unit or chip and a programming operation is caused to begin. While that first memory unit is busy performing that program operation, data is transferred from the controller to a second memory unit and a programming operation is caused to begin in that unit. Data transfer can begin to the first memory unit again once it has completed its programming operation even though the second unit is still busy performing its program operation. This pipelined operation readily extends to more than two memory units. In this manner a high degree of parallelism in programming operations is achieved without incurring the latency cost of performing the additional data transfers.

To further increase programming parallelism, in another principal aspect of the present invention, each of pipelined programming operations is a parallel page programming operation.

In a further aspect of the present invention, two sets of embodiments are presented, one that preserves the host data in a buffer until successful programming of that data is confirmed and one that does not preserve the data on the controller. The second of these thus achieves a higher rate of data programming throughput as it does not wait for a successful programming to be achieved before reloading the buffer. In a further variation, an extra copy of the data can be maintained on the memory unit.

Additional aspects, features and advantages of the present invention are included in the following description of exemplary embodiments, which description should be read in conjunction with the accompanying drawings.

BRIEF DESCRIPTION OF THE DRAWINGS

FIGS. 4a and 4b illustrate single page programming.

FIGS. 5a, 5b and 5c illustrate parallel page programming in a single memory unit.

DESCRIPTION OF EXEMPLARY EMBODIMENTS OF THE INVENTION

Figure 1:
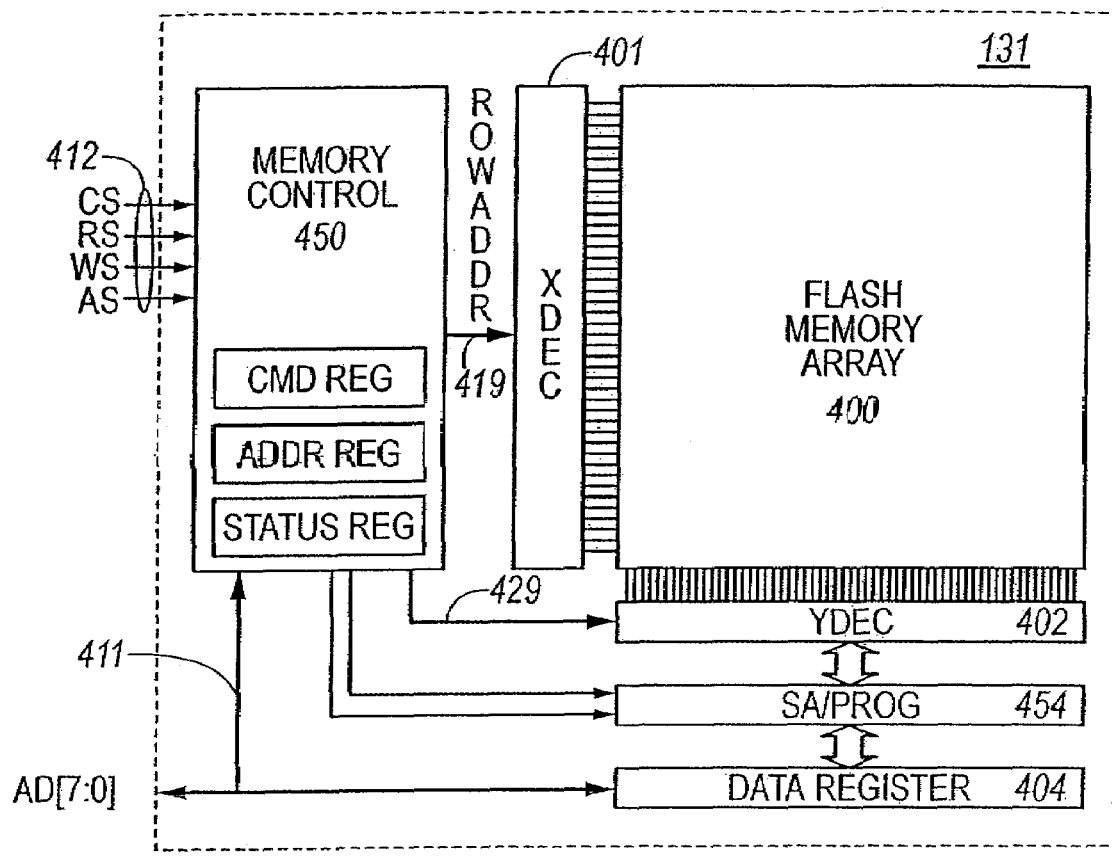
FIG. 1 is a block diagram of a typical prior art flash EEPROM memory array with memory control logic, data and address registers.

The various aspects of the present invention are applicable to non-volatile memory systems in general. Although the description below, as well as that in the Background, is given mainly in terms of an EEPROM Flash memory embodiment, the particular type of storage unit used in the memory array is not particularly important in the present invention. The particulars of how the storage elements are read, are written, and store data do not enter in to the main aspects of the present invention and can be those of any of the various non-volatile systems.

In order to improve performance by reducing programming time, a goal is to program as many cells in parallel as can reasonably be done without incurring other penalties. One implementation divides the memory array into largely independent sub-arrays or units, each unit in turn being divided into a large number of blocks, as described in U.S. Pat. Nos. 6,426,893, and 6,570,785, which are incorporated by reference above. Pages of data are then programmed at the same time into more than one of the units. Another configuration further combines one or more of these units from multiple memory chips. These multiple chips may be connected to a single bus (as shown in FIG. 2) or multiple independent busses for higher data throughput.

An extension of this is to link blocks from different units for programming, reading and erasing together, as described in U.S. patent application Ser. No. 09/766,436, filed Jan. 19, 2001, which is incorporated by reference above. In this arrangement, blocks from different units can be operated together as a metablock. As with the memory embodiments described above, each block, the smallest erasable group of the memory array, is typically divided into multiple pages, a page containing the smallest number of cells that are programmable together within the block. Therefore, a programming operation of a metablock will usually include the simultaneously programming of data into at least one page of each of the blocks forming the metablock, which is repeated until the metablock is full or the incoming data has all been programmed. Other metablocks are formed of different blocks from the array units, one block from each unit. The extensions discussed below can all be combined with metablock operation.

The present invention further increases programming parallelism by allowing the pipelined programming of multiple memory units connected to the same controller. This increases the system's programming parallelism without incurring additional data transfer latency. Data is transferred from a controller to a first memory chip and a programming operation is caused to begin. While that first memory chip is busy performing that program operation, data is transferred from the controller to a second memory chip and a programming operation is caused to begin in that chip. Data transfer can begin to the first memory chip again once it has completed its programming operation even though the second chip is still busy performing its program operation. In this manner high parallelism of programming operation is achieved without incurring the latency cost of performing the additional data transfers.

Figure 2:
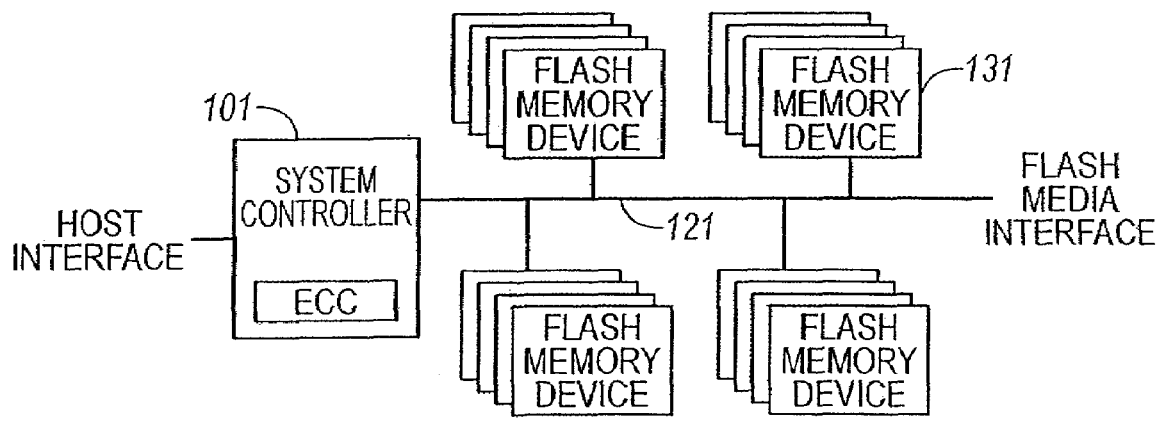
FIG. 2 illustrates an architecture utilizing memories of FIG. 1 with a system controller.
Figure 3:
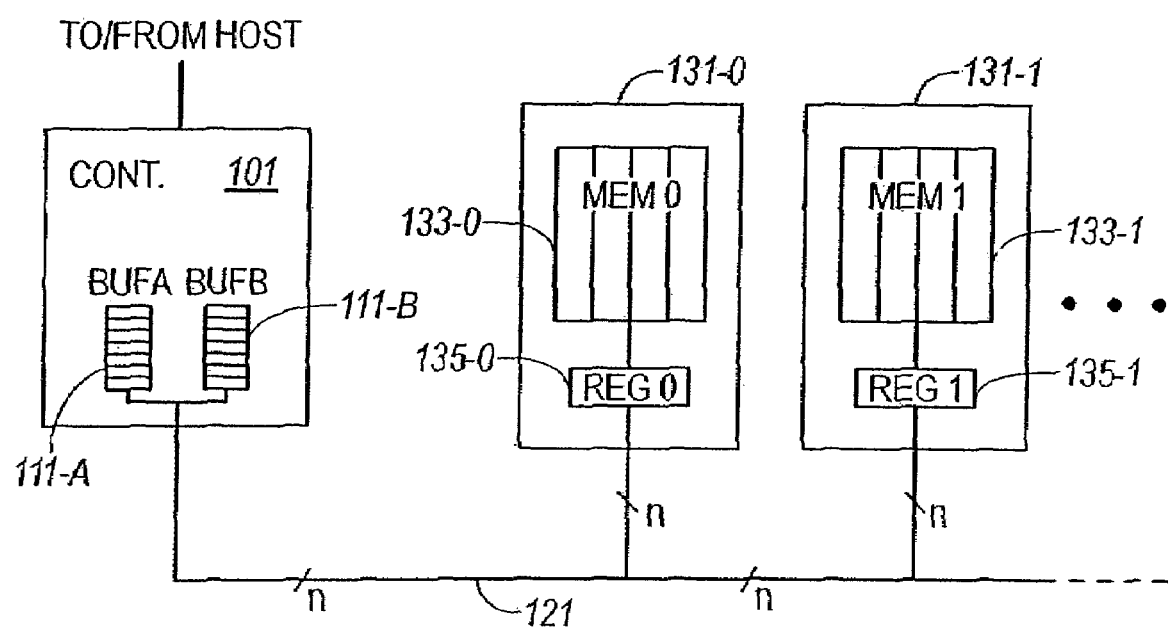
FIG. 3 illustrates some elements of a non-volatile memory referred to in FIGS. 4-7.

FIG. 3 is a block diagram showing some elements of a non-volatile memory such as that in FIGS. 1 and 2. The other elements are suppressed in FIG. 3 in order to simplify the discussion, but are shown in more detail in, for example, U.S. Pat. Nos. 6,426,893 and 6,570,785, incorporated by reference above.

FIG. 3 shows memory controller CONT 101 connected to a pair of memory units 131-0 and 131-1 through a data bus 121. The connections for address and control information that would constitute the other portions of the bus shown in FIG. 1 are here omitted. There can be a number of additional such memory units connected to the bus as shown by the series of dots, each of which has an independent CS signal so that they may be time multiplexed. The controller 101 is shown as containing a pair of buffers BUFA 111-A and BUFB 111-B for temporarily storing data to be transferred between the host system and the memory units. There may again be additional buffers, the actual physical buffers may be formed as a single structure, which is here shown divided for explanatory purposes, and their number will in general not correspond to the number of memory units. The bus 121 is n-bits wide and for most of the discussion n is taken as eight, corresponding to the bus 411 of FIG. 1. The connection of the memory units to bus are also taken as being n-bits wide, although as discussed below this is not necessary. It is understood that the bus width can comprise a number of signals other than eight.

Each of the memory units 131-i has an array of memory cells MEM 133-i in which the data is stored and a register REG 135-i for storing temporarily storing the data as it is transferred between the array 133-i and bus 121. Each of the arrays is shown subdivided into, here, four subarrays into which pages may be programmed in parallel as described in U.S. Pat. Nos. 6,426,893 and 6,763,424, incorporated by reference above. The controller 101 and the memory units 131-i are commonly placed on separate chips and may be referred in that manner below, although one or more of the memory units can be on the same chip as the controller. Alternately, more than one of the memory units may be formed on the same integrated circuit, but on a distinct chip from the controller 101. The memory units 131-i and controller 101 may form a single card for attachment to a host, may all be embedded in the host, or just the controller 101 may be embedded in the host with the memory units 131-i forming a removable card structure. In any of the embodiments, each of the memory arrays 131 are independent in that the controller can independently load command, address, and transfer data to them.

According to the present invention, the transfer of data from the controller's buffers 111 to the memory units' registers 135 and the subsequent writing of data from the register 135-i to the array 133-i is pipelined. Furthermore, within each memory unit, parallel page programming can be used to write the data.

For example, a first set of data is received by the controller 101 from the host via the external interface and loaded into buffer BUFA 111-A. A first memory unit, here MEMO 131-0 is selected and the first set of data is then transferred to REG0 135-0. While this first set of data is being transferred from the controller 101 to the memory 131-0, a second set of data is loaded from the host onto BUFB 111-B. Once the first set of data is transferred and loaded into REG0 135-0, the bus 121 is free and can be used for transferring the second set of data. A second memory unit, MEM1 131-1, has its select signal asserted and the second set of data is transferred from BUFB 111-B to REG1 135-1; furthermore, since the first set of data is in REG0 135-0, it can be programmed into the array MEM0 133-0. Consequently, the transfer of the second set of data from the controller to the second memory unit will occur concurrently with the programming of the first set of data into the first memory unit. Additionally, as the data transfer time from buffer to register is generally much less than the time to write the data once it is in the register, the programming of the second set of data can start before the first set of data is written.

The transfer of data from the controller buffer to the memory unit register and the subsequent writing of this data into the array can either be done as single page or parallel page. Also, once the second set of data is loaded into BUFA 111-B, the process can continue with reloading BUFA 1-A (or another buffer) with a third set of data from the incoming stream, which can then be transferred, (either to a third memory unit or REG-0 135-0 if it is ready) once the second set has been transferred, and so on. To better help explain these various embodiments, FIGS. 4-7 show the various timings involved.

FIG. 4a is an example of single-page programming with the buffers holding data for four sectors in this example. As the data comes into the controller via the external interface from the host, the first set of data is transferred into buffer A. After the four pages of data are loaded at time t, they are individually transferred through the controller/memory interface and programmed into the memory. First, data for sector 1 is transferred into, say, register 135 and subsequently programmed into page 1. After the data is written and verified, the same process is repeated sequentially for sector 2 and so on for sectors 3 and 4. While this transfer/program process is going on, data can be transferred in to buffer B. Here it is shown to occur just after buffer A is loaded and the transfer to register of the first sector has begun. Once sector 4 has been programmed and verified, data for sector 5 is then transferred to a register, either in the same memory unit or another unit connected to the controller.

For each block of memory cells, the process is represented schematically in FIG. 4b. This begins with the buffer being loaded with pages during interval 41. Subsequently, after time t during interval 42 the data is transferred to the memory unit's register a page at a time, where it is then programmed and verified in the sector during interval 43. If another block of cells becomes available for subsequent programming as a result of this operation, that block can then be erased during interval 44 and the process of FIG. 4a repeated.

Parallel page programming on a single chip or memory unit is shown in FIG. 5a, again for the four-sector example. The first set of data is loaded via the external interface from the host into buffer A as before, but now after time $t_1$ the data for all four sectors are transferred to the memory prior to the beginning of programming. Although this is shown as a transfer of data for sector 1 followed by sector 2 and so on, more generally portions of each are transferred until complete as described in U.S. Pat. Nos. 6,426,893 and 6,763,424, incorporated by reference above. Once the data transfers for all the pages are complete in their respective data registers, the four pages are programmed in parallel into their respective memory cells until verified at a time $t_2$. During the interval between $t_1$ and $t_2$, the data for the next four pages can be transferred from the host into buffer B. After time $t_2$ this second set of data can then be transferred and programmed in the same or another memory unit and so on.

For each block of memory cells, the process is represented schematically in FIG. 5b and is similar to in operation to FIG. 4b. As in the previous single-page programming example, another block of cells may become available for subsequent programming as a result of the programming operation. That block can then be erased during interval 54 and the process of FIG. 5a repeated. As shown in FIG. 5c, the data transfer 51b and 52b and programming 53b operations may overlap in time with the erase operation 54a provided that the block being erased is in an array of cells that is independent from the cells being subsequently programmed.

Figure 6A:
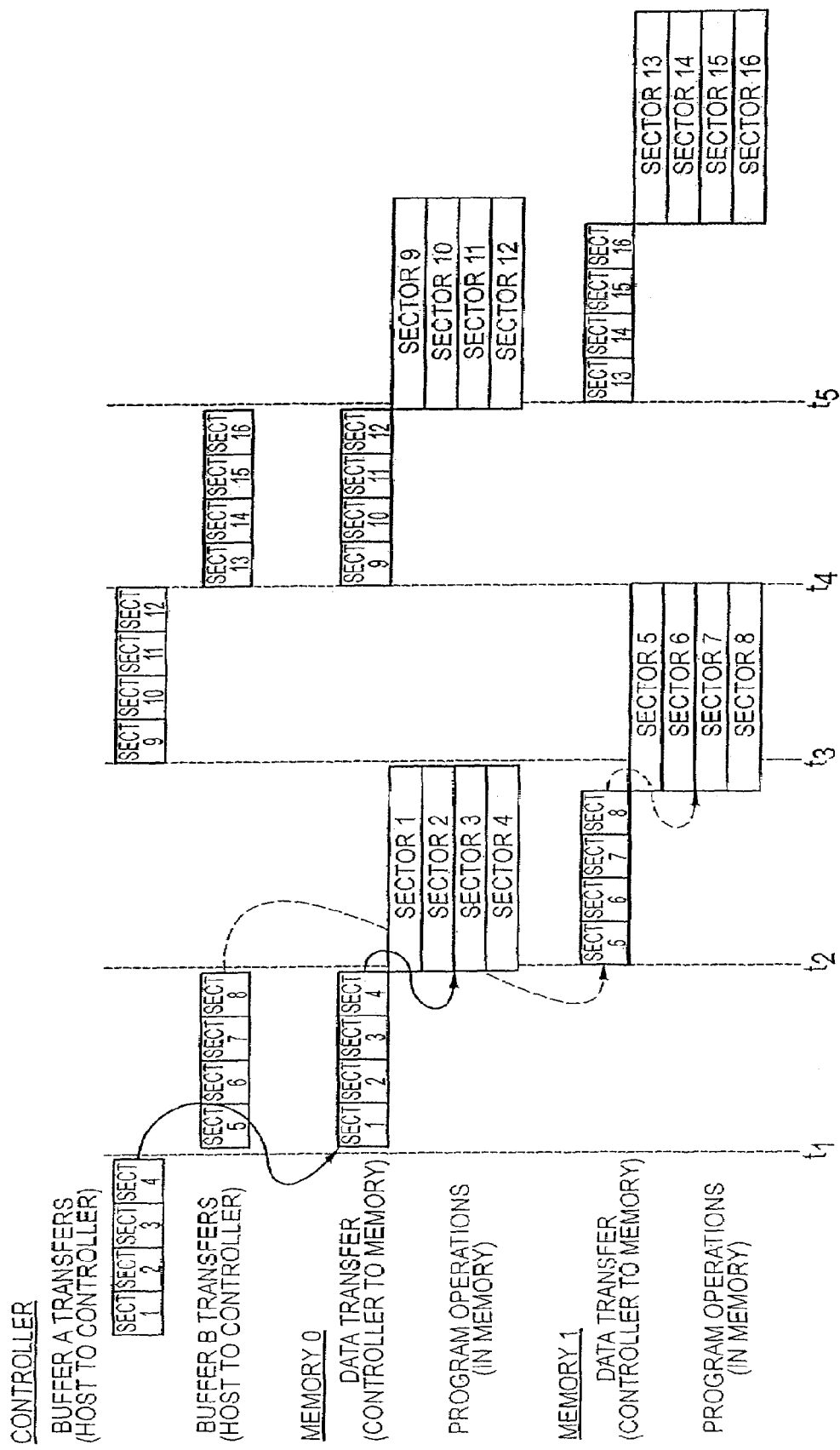
FIGS. 6a and 6b illustrate multiple memory unit pipelined parallel page programming keeping host data.

Several aspects of the present invention are shown in FIG. 6a that illustrates an embodiment of pipelined parallel page programming in multiple independent memory units. This is again illustrated for four sectors, although it readily extends to other numbers or even to single page programming in each unit. To keep the diagrams manageable, this is shown for two memory units, such as 131-0 and 131-1 in FIG. 3, and two buffers, such as BUFA 111-A and BUFB 111-B.

The process of FIG. 6a begins with the first data set being loaded via the external interface into BUFA 111-A until all the pages in the set are transferred at time $t_1$, after which the next set of data can be loaded into BUFB 111-B. Here the loading of the second buffer is shown as starting at time $t_1$, but can start later and in particular need not finish at time $t_2$. Any further incoming data will be either loaded into buffer A when it is free or into additional buffer space not shown.

Once the first data set is loaded into BUFA 111-A at time $t_1$, it is transferred via bus 121 into memory unit 131-0 when it is stored in REG0 135-0, finishing at time $t_2$ as described above with respect to FIG. 5a. Once transferred, the pages to which the first data set are assigned are programmed in parallel into array MEM0 135-0, finishing at time $t_3$.

Once the first data set is transferred from BUFA 111-A to REG0 135-0 at time $t_2$, bus 121 is free to transfer the second set of data from BUFB 111-B to REG1 135-1. The second set of data is then written into array MEM1 135-1, finishing at time $t_4$. Since the time to transfer data from a buffer in the controller to a memory unit's register is generally shorter than the time to program this data into the array, the writing of the second set of data will usually start between times $t_2$ and $t_3$ so that both arrays are being programmed concurrently and independently.

Once the first set of data is transferred out of buffer A and second set of data is loaded in to buffer B, the next set of the data stream could be loaded into buffer A. This would, however, overwrite the first set of data. There are two ways to implement pipelined programming, one that preserves the host data in a buffer until successful programming of that data is confirmed and one that does not require that success be achieved and that does not preserve the data thus achieving a higher rate of data programming throughput. It is often preferred to maintain an uncorrupted copy of the data outside of the register as the register contents may be altered in the course of the program and verify process. In the embodiment of FIG. 6a, the first data set is kept in buffer A until it is successfully written at time $t_3$, when a new set of data, shown here as Sectors 9-12, is transferred in to replace the earlier set. The process then continues as already describes, with $t_4$ replacing $t_1$ and $t_5$ replacing $t_2$ in the second round. Again, it should be noted that in this embodiment buffer A can be reloaded as soon as the first set of data is successfully programmed into the first memory so that the first data set is no longer needed and need not be coincidental with programming in the second finishing. Consequently, although both processes are shown to finish at $t_4$, this will not in general be the case.

Figure 6B:
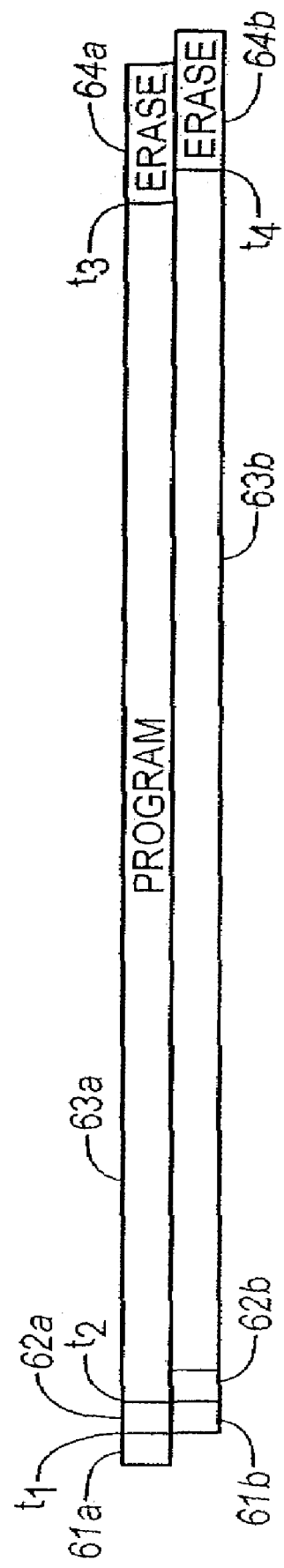

Since the blocks programmed in memory 0 and memory 1 constitute a metablock, their programming may cause another metablock to become available for subsequent programming. FIG. 6b shows how the erase of the latter metablock, comprising the erase of one block in memory 0 and another block in memory 1, can be broken into two staggered erase events. The first erase 64b can begin as soon as the final programming operation to the former programmed block in memory 0 63a is complete. This allows memory 0 to be available for subsequent programming of data before the erase operation in memory 1 64b is complete.

Figure 7:
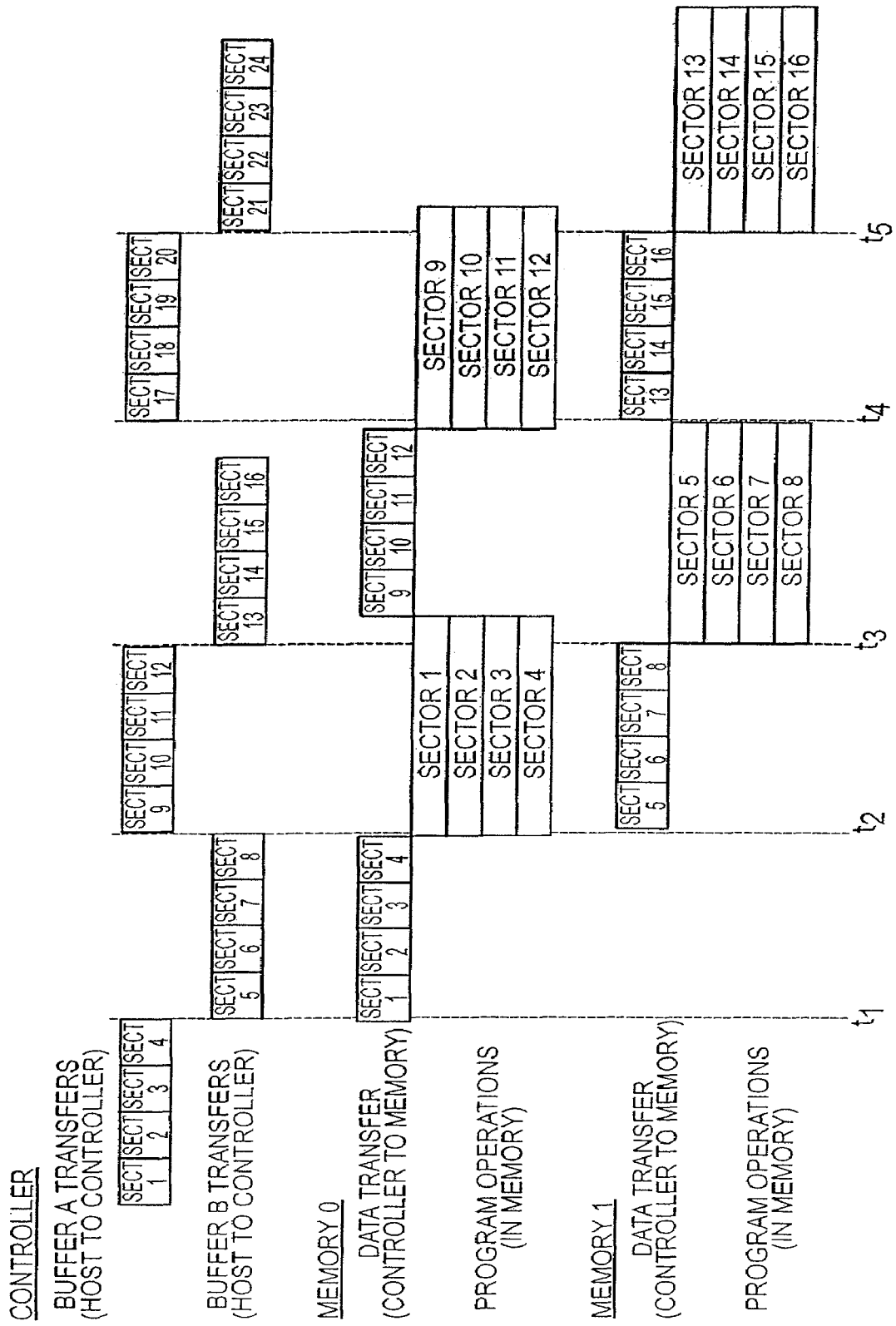
FIG. 7 illustrates multiple memory unit pipelined parallel page programming.

FIG. 7 shows an embodiment where a set of data is not maintained in the host buffer until it is written in to the memory array. Such a system is possible when storage of the data in the controller until the data is successfully programmed in the memory is not necessary. The use of this technique increases the rate of data programming throughput as a new set of data can be transferred from buffer A to the first memory unit as soon as the first set is successfully programmed without waiting to reload this new data set into buffer A. Consequently, in the embodiment of FIG. 7 buffer A is reloaded after $t_2$ with the third set of data and, once this is complete at $t_3$, a fourth set of data is loaded into buffer B. (It should be noted that $t_3$, $t_4$, and $t_5$ in FIG. 7 do not directly correspond to the same markings in FIG. 6a.)

Once the successful programming of the first set of data is confirmed in the first memory unit, the third set (Sectors 9-12) is transferred to the first memory and written as with the first set. Similarly, once the second set of data is written into the second memory unit, the fourth set of data is transferred.

In FIG. 6a, the solid arrows show the progression of the first set of data. As data comes in to the controller, the first four pages are transferred into buffer A. Once this is complete, it is transferred down the bus until it is loaded onto the first memory unit, MEM0, at which time it is written in to the array. The process for the second data set is shown by the broken arrow. As soon as buffer A is filled, the incoming data goes into buffer B. Once buffer B is filled and the bus is free from transferring the first data set, the second data set is transferred into the second memory unit, MEM1. (In an embodiment with a wider data bus, the transfer of the second data set need not wait for the first set to complete its transfer.) Once all the pages of the second data set are complete in the register of the second memory unit, it can be written. Similarly, once the second data set is written into buffer B, a third set of the incoming data (here sectors 9-12) can be written into a buffer when this comes available, either in buffer A according to either the embodiment of FIG. 6a or 7 or else in another buffer if available. Also, once the third set is transferred to the buffer and a data bus is free, it can then be transferred into the first memory unit (once the first data set in written) or another available memory unit.

As already noted, in FIGS. 6a and 7, the sizes of the blocks are just meant to be illustrative of the causal relationships and may not accurately reflect block sizes in actual memories. Concerning the relative size of the various time intervals involved, in a particular embodiment exemplary values are ~120 μs to transfer four pages of data from the host into a buffer, ~160 μs to transfer this data set from the buffer to a memory unit's register, ~200 µs to write the four pages, and ~1-4 ms for the erase time. Although the process of FIG. 7 will be faster than that of FIG. 6a, it may be less reliable in some circumstances since it does not maintain the data in the buffers until its successful programming is confirmed. In a set of alternate embodiments the data may be maintained elsewhere, allowing the buffer to be reloaded after transfer as in FIG. 7 for increased speed while keeping an uncorrupted copy of the data set. For example, it could be maintained in the controller, although this increases the amount of RAM required in the controller. In another embodiment, it is maintained on the memory unit itself, thereby saving the need to re-transfer the data set should it be needed. Referring to FIG. 3, each memory unit 131-i would have additional RAM memory, for example by enlarging register 135-I, where a back-up copy of the data set could be loaded in at the same time it is transferred to register REGi 135-i. Such an arrangement is described in U.S. Pat. No. 6,349,056. Also as described there, this arrangement also lets the end result of the programming process be verified without transferring the result back to the controller to be checked with error correction code.

As noted above, the embodiments of FIGS. 6 and 7 use parallel page programming. The invention can also be implemented in a pipelined single page embodiment. In this case, the data for sector 1 is transferred to the first memory unit and written. After the data for sector 1 is transferred, while it is being written, the data for sector 5 is transfer to and programmed in the second memory unit. The process then continues with sector 2 and sector 6 and so on. The pipelined single page programming process can be in embodiment with or without keeping the data in the buffer until it is confirmed written.

Also as noted above, the embodiments of FIGS. 6 and 7 readily extend to more than two buffers, more than two memory units, or both. For example, referring to FIG. 6b, data could be loaded into a third buffer after time $t_2$, then transferred and written into a third memory unit following the transfer in interval 62b. Additionally, these embodiments can be combined with the sort of metablock operation described in U.S. Pat. No. 6,763,424, which is incorporated by reference above, where blocks from different units can be operated together as a metablock.

As shown in FIG. 3, data is transferred between the controller CONT 101 and memory units 131-0, 131-1, and so on through a common n-bit data bus, that typically is a byte (n=8) wide. As discussed in the Background sections, the use of the single, uniform width bus has advantages for interconnectivity and routability, particularly when the memory units and controller are formed on different chips. More generally, the memory units may be connected to controller through only part of the bus. For example, the bus from the controller could 16-bits wide, while each of a pair of memory units are each connected to a different 8 bits of the bus. This is similar to an arrangement found in the prior art. Unlike the prior art, when the various aspects of the present invention are used in such an embodiment, the data transfers and programmings for the two memory units no longer need to be performed simultaneously and can implemented as in FIGS. 6 and 7.

The present invention can also be applied in systems previously mentioned that employ multiple parallel busses between the controller and various memories. This would increase the efficiency of operation of each of the busses further increasing overall data program throughput of the system.

As mentioned above, although the discussion so far has referred mainly to embodiments using a charge storing device, such as floating gate EEPROM or FLASH cells, for the memory device, it can be applied to other embodiments, including magnetic and optical media. As the particulars of how the storage elements are read, are written, and store data do not enter into the main aspects of the present invention, the various aspects of the present invention may be applied to other memory types, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the invention has been described with respect to various exemplary embodiments, it will be understood that the invention is entitled to protection within the full scope of the appended claims.

It is claimed:

1. A memory system, comprising:
   a memory, including
      a plurality of independently controllable non-volatile data storage sections each having a plurality of memory cells;
      a corresponding plurality of data registers associated with a respective data storage section; and
      write circuitry whereby data content held in a given data register can be programmed into the corresponding data storage section; and
   a controller for controlling the transfer of data between a host to which the memory system is connected and the data storage sections, including:
      a plurality of data buffers, and
   a data bus whereby data content can be transferred from the data buffers to the data registers,
   wherein the memory system can perform a plurality of overlapping data write operations, a write operation for a data set including the sequential sub-operations of: a) transferring the data set from the host to one of the data buffers; b) transferring said data set from said one of the data buffers though the data bus to one of the data registers; and c) programming the data set from said one of the data registers into the corresponding one of the data storage sections, wherein sub-operations a) and b) of one write operation are performed concurrently with sub-operations b) and c), respectively, of a preceding overlapping write operation.

2. The memory system of claim 1, wherein sub-operation c) of said one write operation starts during sub-operation c) of said preceding overlapping write operation.

3. The memory system of claim 1, wherein the non-volatile data storage sections are formed of a plurality, of units of erase, the memory further including:
   erase circuitry whereby data content held in the units of erase can be selectively erased, wherein the data write operation further includes sub-operation of: d) subsequent to programming the data set, performing an erase operation in said one of the data storage sections, wherein sub-operation d) of a preceding overlapping write operation begins during sub-operation c) of said one write operation.

4. The memory system of claim 1, wherein, during the data write operation, subsequent to sub-operation b) of said overlapping data write operation, a copy of said data set is maintained in the corresponding one of the data buffers until the corresponding sub-operation c) is completed.

5. The memory system of claim 1, wherein during the data write operation, subsequent to sub-operation b) but prior to completion of sub-operation c) of said preceding overlapping write operation, performing sub-operation a) of a subsequent overlapping write operation using the same data buffer as used in the preceding overlapping write operation.

6. The memory system of claim 1, wherein said data sets comprise multiple sectors of data and wherein said write circuitry can concurrently program multiple sectors of data from a given data register into the corresponding data storage section.

* * * * *